(12) United States Patent
Sakamoto et al.

(10) Patent No.: US 6,486,724 B2
(45) Date of Patent: Nov. 26, 2002

(54) FET BIAS CIRCUIT

(75) Inventors: Hironori Sakamoto, Mitaka (JP); Tamaki Honda, Mitaka (JP); Taketo Takahashi, Mitaka (JP)

(73) Assignee: Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 09/773,354

(22) Filed: Jan. 31, 2001

(65) Prior Publication Data

US 2001/0015668 A1 Aug. 23, 2001

(30) Foreign Application Priority Data

Feb. 23, 2000 (JP) ........................................ 2000-045312

(51) Int. Cl.[7] ............................................ H03K 17/687
(52) U.S. Cl. ............................................ 327/427; 327/83
(58) Field of Search ................................. 327/513, 538, 327/540, 563, 560, 378, 77, 80, 81, 83, 427, 512, 530, 541, 543; 323/280, 281

(56) References Cited

U.S. PATENT DOCUMENTS 4,843,265 A * 6/1989 Jiang ........................... 307/591
5,422,593 A * 6/1995 Fujihira ....................... 327/561
6,037,832 A * 3/2000 Kaminishi ................... 327/538

FOREIGN PATENT DOCUMENTS

| JP | 05175747 A | 7/1993 |
| JP | 06029751 A | 2/1994 |
| JP | 07321561 A | 12/1995 |
| JP | 11004125 A | 1/1999 |

* cited by examiner

Primary Examiner—Terry D. Cunningham
Assistant Examiner—Long Nguyen
(74) Attorney, Agent, or Firm—Samuels, Gauthier & Stevens, LLP

(57) ABSTRACT

A circuit for biasing an FET, comparing a gate bias voltage of the FET with a reference voltage at an operational amplifier and performing closed-loop control on the gate bias voltage of the FET with the output of the operational amplifier. The temperature characteristics of the mutual conductance of the FET is compensated by setting the temperature characteristics of one or both of two voltage dividing resistors. Variations in a drain bias current due to input signal level and temperature changes can be suppressed. The circuit at the gate and the circuit at the drain are separate, making possible class A, class AB, and class B operations. The voltage drop at the gate resistor can be ignored so that the gate resistor can be designed with priority given to stability of the RF characteristics.

7 Claims, 5 Drawing Sheets

FET BIAS CIRCUIT

BACKGROUND OF THE INVENTION

1. Field of the Invention

The present invention relates to a circuit for biasing a field effect transistor (FET).

2. Description of the Related Art

Circuits employing FETs, such as amplifiers, are used in radio frequency (RF) circuits for radio communications equipment. FIG. 3 shows an example of an RF amplifier using an FET. The FET in the figure is, for example, a GaAs FET. This FET amplifies an input signal that is supplied to the gate from an input terminal IN via a capacitor C1 and supplies an amplified signal from the drain to an output terminal OUT via a capacitor C2. The drain of the FET is connected to a positive power supply (+VDD) via a resistor Rd, the source is connected to ground, and the gate is connected to a negative power supply (−VSS) via a resistor Rg2.

Furthermore, a circuit for biasing the FET in FIG. 3 is a regulated-current bias circuit that constantly maintains a drain bias current Idsdc at a fixed level and comprises a bipolar transistor Tr1, resistors Rb1, Rb2, Rg1, Rg2, and Rd, and a diode D1. One end of resistor Rb1 is connected to the positive power supply (+VDD) and the other end is connected to the anode of diode D1. One end of resistor Rb2 is connected to the cathode of diode D1 and to the base of transistor Tr1, and the other end is connected to ground. Therefore, the series circuit formed from resistors Rb1 and Rb2 and diode D1 is a dividing circuit for dividing the supply voltage VDD to generate voltage Vb and applying it to the base of transistor Tr1. The series circuit is also a temperature compensation circuit for compensating through diode D1 a temperature dependency appearing in the base-emitter voltage of transistor Tr1 and in turn the emitter current. In relation to this compensation operation, it should be noted that the collector of transistor Tr1 is connected to the gate of the FET via resistor Rg1, and the emitter is connected to the drain of the FET. Since transistor Tr1 is provided in this sort of configuration, the drain bias current Idsdc of the FET is held at a fixed value of Idsdc=(VDD−Vb−Vbe)/Rd mainly due to the action of the diode D1 even if a change occurs in the emitter voltage of transistor Tr1 due to a change in temperature. Furthermore, since the gate impedance of the FET, which is ideally infinite, is actually a finite value, a minute current flows to the gate of the FET. This gate current Igsdc is limited by resistors Rg1 and Rg2, which are connected to the gate of the FET, so that the long-term reliability of the FET is maintained. Furthermore, since resistor Rg1 is provided, the impedance when viewing the transistor Tr1 from the FET is that much higher and the radio frequency amplification characteristics become more stable.

Regarding the regulation of the drain bias current Idsdc as a constant current, refer to Japanese Patent Laid-Open Publication No. Hei 7-321561. Regarding temperature compensation by the diode D1, refer to Japanese Patent Laid-Open Publication No. Hei 5-175747. Furthermore, the gate bias voltage, gate current, drain bias voltage, and drain bias current are respectively denoted in the figure by Vgsdc, Igsdc, Vdsdc, and Idsdc during no signal input and Vgsrf, Igsrf, Vdsrf, and Idsrf during signal amplification (when the output signal level is high). In the description hereinafter, Vgsdc, Igsdc, Vdsdc, and Idsdc are used for the symbols or variable names, unless whenever a distinction is required.

In the circuit shown in FIG. 3, the emitter current of transistor Tr1 is supplied via resistor Rd. Thus, the power dissipation at resistor Rd is large compared to the circuit of FIG. 4 to be described hereinafter. Furthermore, since the drain bias current Idsdc is regulated as a constant current, the circuit of FIG. 3 cannot be used in a class AB or class B amplification mode in which the drain current varies according to the input signal level. Namely, the circuit of FIG. 3 can only be used for class A amplification. Thus, it is difficult to achieve large power amplification at a high efficiency.

A regulated voltage bias circuit that does not have this type of problem is shown in FIG. 4. In the circuit shown in this figure, the output voltage of the constant voltage source V1 that is implemented from a resistance-type dividing circuit, a voltage regulator, an operational amplifier, and so forth, is applied to the gate of the FET via the resistor Rg. Since the circuit at the gate side of the FET is completely separate from the circuit at the drain side in the figure, the drain bias current Idsdc can be more freely set unlike the circuit of FIG. 3. Therefore, the FET can be made to function in a class A, class AB, or class B configuration. Namely, by configuring the constant voltage source V1 so that the output voltage can be adjusted and by adjusting the output voltage of the constant voltage source V1 to an appropriate value, the gate bias voltage Vgsdc can be set to a target value, and in turn the drain bias current Idsdc can be set to an appropriate value. Thus, the circuit shown in FIG. 4 can be used in various applications from small signal amplification in class A operation to large signal amplification in class AB or class B operation. Furthermore, the gate bias voltage Vgsdc is applied from the constant voltage source V1 via resistor Rg. Thus, the gate bias current Idsdc is limited by resistor Rg so that the long-term reliability of the FET can be maintained. For the same reason, the impedance is high, when the constant voltage source V1 is viewed from the FET, to further stabilize the RF amplification characteristics.

However, the above-mentioned conventional circuit has several problems.

First, a compensation circuit having a complex configuration becomes necessary when implementing the circuit shown in FIG. 4. Here, the compensation circuit refers to a circuit for compensating for variations in the gate current Igs accompanying changes in the input signal level, temperature, and so forth. When the gate current Igsdc varies, the gate bias voltage Vgsdc and further the drain bias current Idsdc also varies as a result. More specifically, the amount of change ΔIdsdc in the drain bias current Idsdc can be expressed in the following equation:

$$\Delta Idsdc = (\Delta Vgsdc1 + \Delta Vgsdc2)*(gm+\Delta gm) = (\Delta Igsdc1 + \Delta Igsdc2)*(gm+\Delta gm)*Rg$$

In this equation, ΔVgsdc1 and ΔIgsdc1 are respectively the amount of change in the gate bias voltage Vgsdc and in the gate current Igsdc accompanying the change in input signal level, ΔVgsdc2 and ΔIgsdc2 are respectively the amount of change in the gate bias voltage Vgsdc and in the gate current Igsdc accompanying the change in temperature, gm is the mutual conductance of the FET, and Δgm is the amount of change in gm accompanying the change in temperature.

Generally, ΔIdsdc appearing in the equation is a quadratic function of temperature and Δgm is a linear function. Thus, with no temperature compensation, the temperature characteristic of the drain bias current Idsdc approximates the quadratic function characteristic, for example, as shown by the broken line in FIG. 5. Obviously, so as to preferably compensate for this temperature characteristic, a temperature compensation circuit having a quadratic function characteristic is necessary. A temperature compensation circuit having such a characteristic generally has a complex configuration, and the use of such a temperature compensation circuit in configuring an RF amplifier results in an increase in circuit size and in the cost of the amplifier. However, if a temperature compensation circuit having a linear function characteristic is used thereby avoiding a complex circuit configuration, the temperature dependency is not well compensated and persists in the characteristic after temperature compensation, as shown by the solid line in FIG. 5.

During no signal input, the gate bias voltage Vgsdc becomes higher than the output voltage of the constant voltage source V1 due to the voltage drop at resistor Rg. Furthermore, when the gate current Igsdc increases due to a rise in temperature, the voltage drop at resistor Rg increases. When the voltage drop at resistor Rg increases, the gate bias voltage Vgsdc rises further. When the gate bias voltage Vgsdc increases, the drain bias current Idsdc increases. This increase, namely, the increase accompanying the rise in temperature, is denoted by $\Delta$Igsdc2 in the equation given above, and is a quadratic functional increase. If temperature compensation is not performed or is insufficiently performed, the FET may also become susceptible to thermal runaway caused by the increase $\Delta$Igsdc2 accompanying the rise in temperature. Furthermore, when a GaAs FET is used, during large signal amplification, the direction of flow of the gate current Igsdc reverses as shown in FIG. 4. (Igsrf is a reverse flow.) When the gate current Igsrf flows from the constant voltage source V1 to the gate, the gate potential of the FET drops (considerably toward the negative direction) due to the voltage drop at resistor Rg. As a result, the drain bias current Idsrf drops, and thus the signal saturation output power of the FET drops during large signal amplification.

The various above-mentioned problems occur due to a combination of the mutual conductance and gate current of the FET depending on the temperature and input signal level, and the resistor Rg being used. In particular, when resistor Rg is set to a large value, the change in the gate current Igsdc and in turn the change in the drain bias current Idsdc increase accompanying the change in temperature or the change in the input signal level. However, it is not preferable to obviate resistor Rg or reduce its value. If resistor Rg is obviated or if the value of resistor Rg is too low, long-term reliability cannot be maintained, depending on the type of FET. Furthermore, if the value of resistor Rg is too small, the RF operation becomes unstable, depending on the type of FET.

SUMMARY OF THE INVENTION

It is therefore an object of the present invention to provide an FET bias circuit as a preferable and simple circuit capable of operating the FET in class A, class AB, and class B configurations and capable of compensating and suppressing changes in the gate current Igsdc due to changes in temperature or in the level of the input signal to the FET.

In order to achieve this object, the circuit at the gate of the FET and the circuit at the drain are separated in the present invention so as to be compatible with all of class A, class AB, and class B, and closed-loop control is performed for the gate bias voltage of the FET so that the amount of change in the input signal level or in temperature can be easily compensated. Namely, the FET bias circuit relating to the present invention comprises the current limiting resistor Rg, which has a first end and a second end, and the closed-loop control circuit coupled to the current limiting resistor Rg. In the present invention, the first end of the current limiting resistor Rg is connected to the gate of the FET. The closed-loop control circuit applies and controls DC voltage to the second end of the current limiting resistor Rg, so that the gate bias voltage Vgsdc of the FET, namely, the voltage appearing at the first end of the current limiting resistor Rg, becomes equal to the reference voltage of a predetermined DC voltage.

According to the present invention, unlike the constant current bias circuit shown in FIG. 3, the circuit at the gate and the circuit at the drain are separate so as to yield an FET bias circuit that is capable of stable operation in classes where the drain current changes in accordance with the signal input level, and suitable for a wide range of applications from small signal amplification in class A to large signal amplification in class AB or class B. Furthermore, closed-loop control is performed for the gate bias voltage Vgsdc so that changes in the gate bias voltage Vgsdc and in turn changes in the operating point of the FET (drain bias current Idsdc), accompanying changes in the input signal level or temperature, can be limited and suppressed.

Furthermore, with the voltage drop at the current limiting resistor Rg being one cause, a phenomenon where stability of the RF (amplification) characteristic deteriorates or a phenomenon where the saturation output voltage drops when the input signal level is high occurred in the conventional circuit shown in FIG. 4. In the present invention by comparison, movement of the FET operating point due to variations in the gate current Igsdc is suppressed by the closed-loop control of the gate bias voltage vgsdc. Thus, when designing the circuit constants, the voltage drop at the current limiting resistor Rg can be ignored and the value of the current limiting resistor Rg can be selected and designed with priority given to the stability of the RF characteristic, and the drop in the saturation output voltage described above does not occur.

Furthermore, the closed-loop control circuit in the present invention can be implemented with a simple circuit configuration using an error amplifier. For example, the reference voltage generation-circuit for generating the above-mentioned reference voltage can be configured as a dividing circuit that can be obtained by connecting a plurality of resistors in series. The reference voltage generation circuit in this case generates the reference voltage by dividing a DC voltage of a predetermined value, such as the supply voltage. Furthermore, this reference voltage and the gate bias voltage of the FET are input by the error amplifier, and a voltage equivalent to their difference is applied to the gate of the FET via the current limiting resistor Rg. In this manner, the FET bias circuit relating to the present invention can be implemented using only resistors and an error amplifier, which may be configured from an operational amplifier. It should be noted that the reference voltage can also be generated by a method other than voltage division and the closed-loop control can be performed using components other than an operational amplifier.

Although the change in the drain bias current Idsdc due to the change in the mutual conductance gm persists, it is a linear characteristic with respect to temperature. Thus, in many cases, the FET is prevented from its thermal runaway without temperature compensation. If temperature compensation is to be performed to secure further improved stability, a circuit for such a purpose can easily be configured as a simple, small, and inexpensive circuit having linear function characteristics. In particular, if the closed-loop control circuit is to be configured from the operational amplifier and reference voltage generation circuit as described above, the change in the drain bias current Idsdc due to the change in the mutual conductance gm can be compensated by only setting and. selecting the temperature characteristics of the reference voltage generation circuit. For example, in the reference voltage generation circuit which is preferably implemented with a dividing circuit, as at least one of the resistors connected in series, an element, such as a temperature sensitive element, having a complementary temperature characteristics with respect to the temperature characteristics of the mutual conductance of the FET is used, to cancel the temperature characteristics occurring in the drain current of the FET caused by the temperature characteristics of the mutual conductance of the FET.

DETAILED DESCRIPTION OF THE PREFERRED EMBODIMENTS

Figure 3:
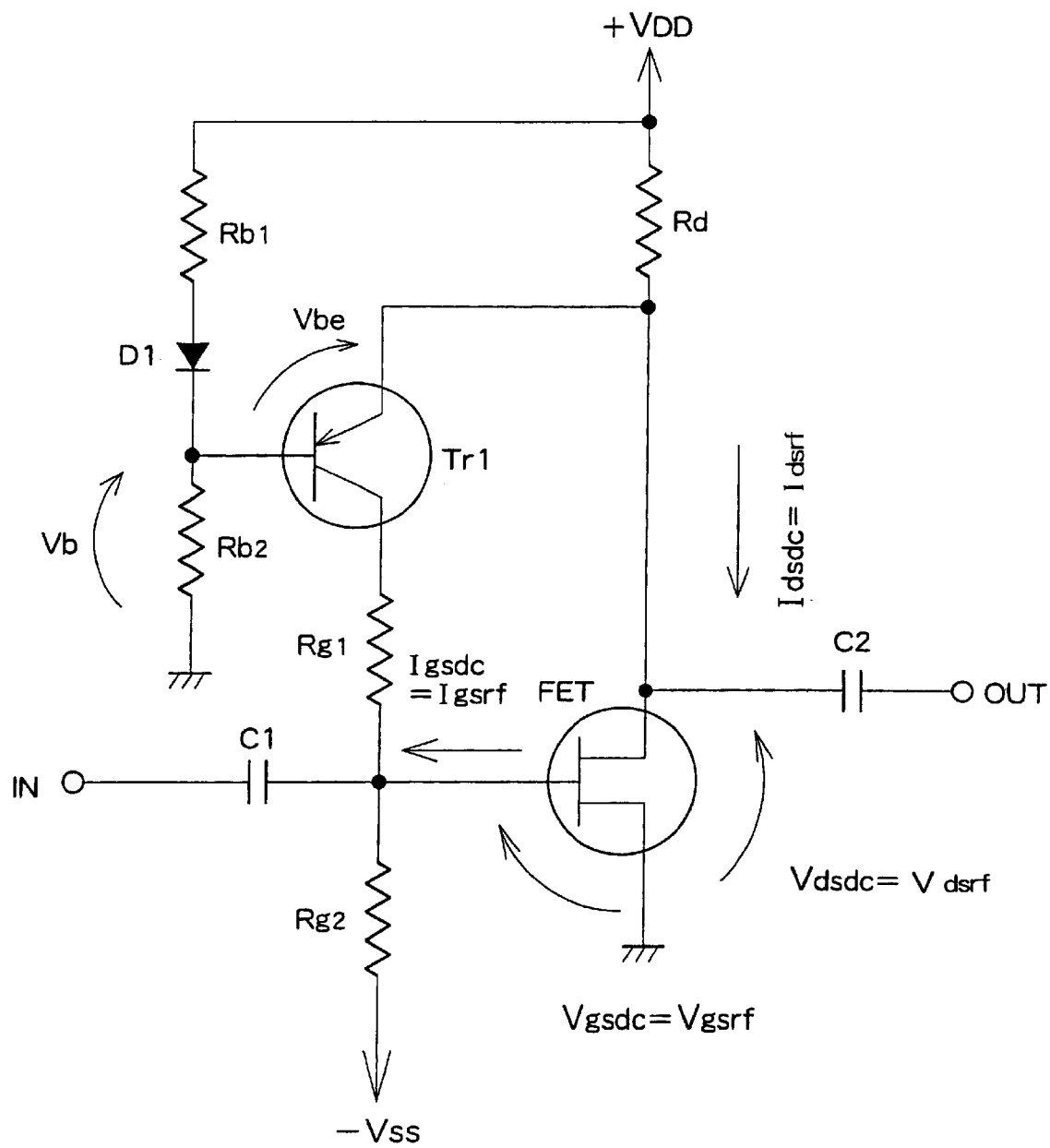
FIG. 3 is a circuit diagram showing a configuration of a circuit relating to the prior art.
Figure 4:
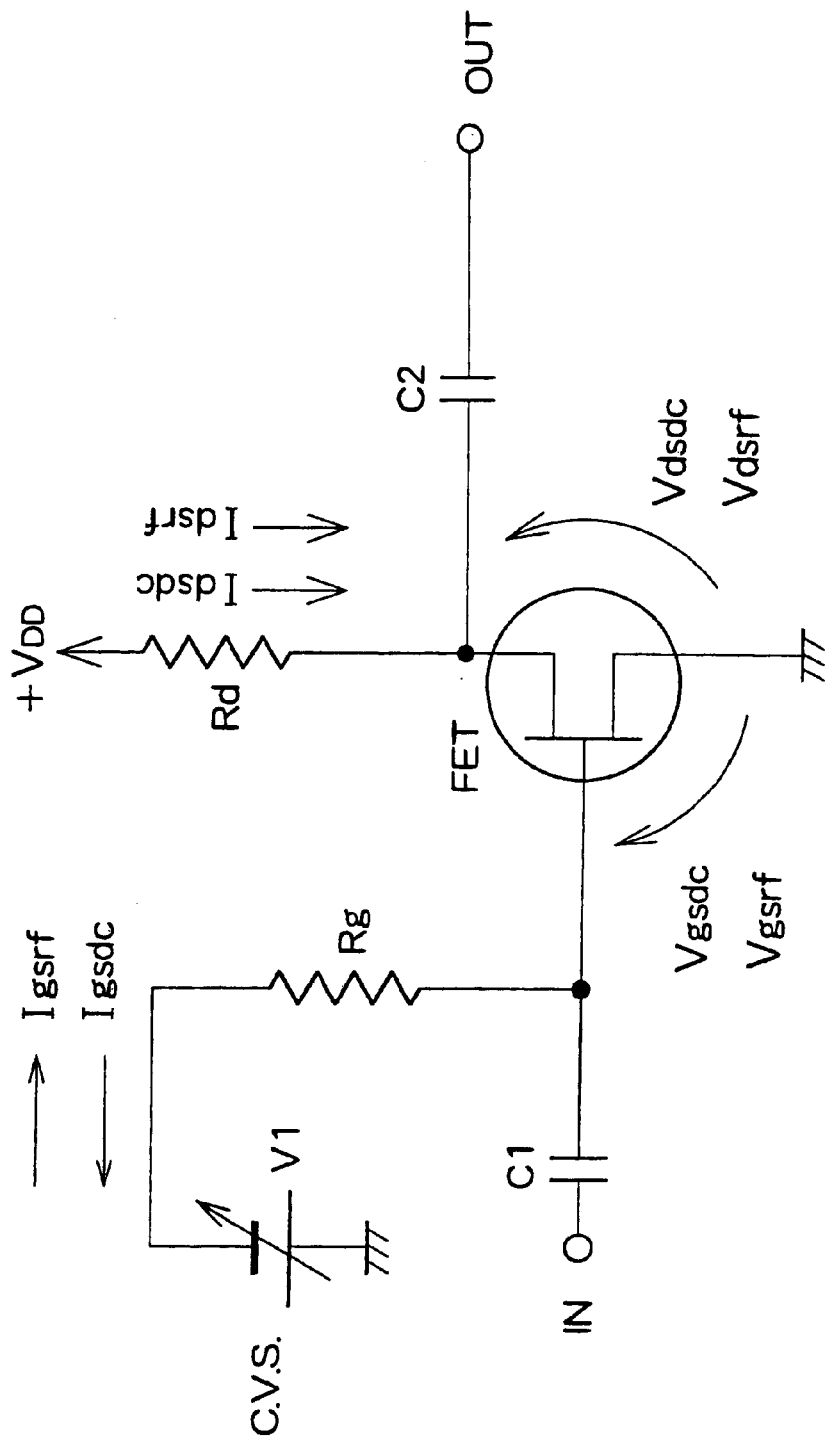
FIG. 4 is a circuit diagram showing a configuration of a circuit relating to another prior art.
Figure 5:
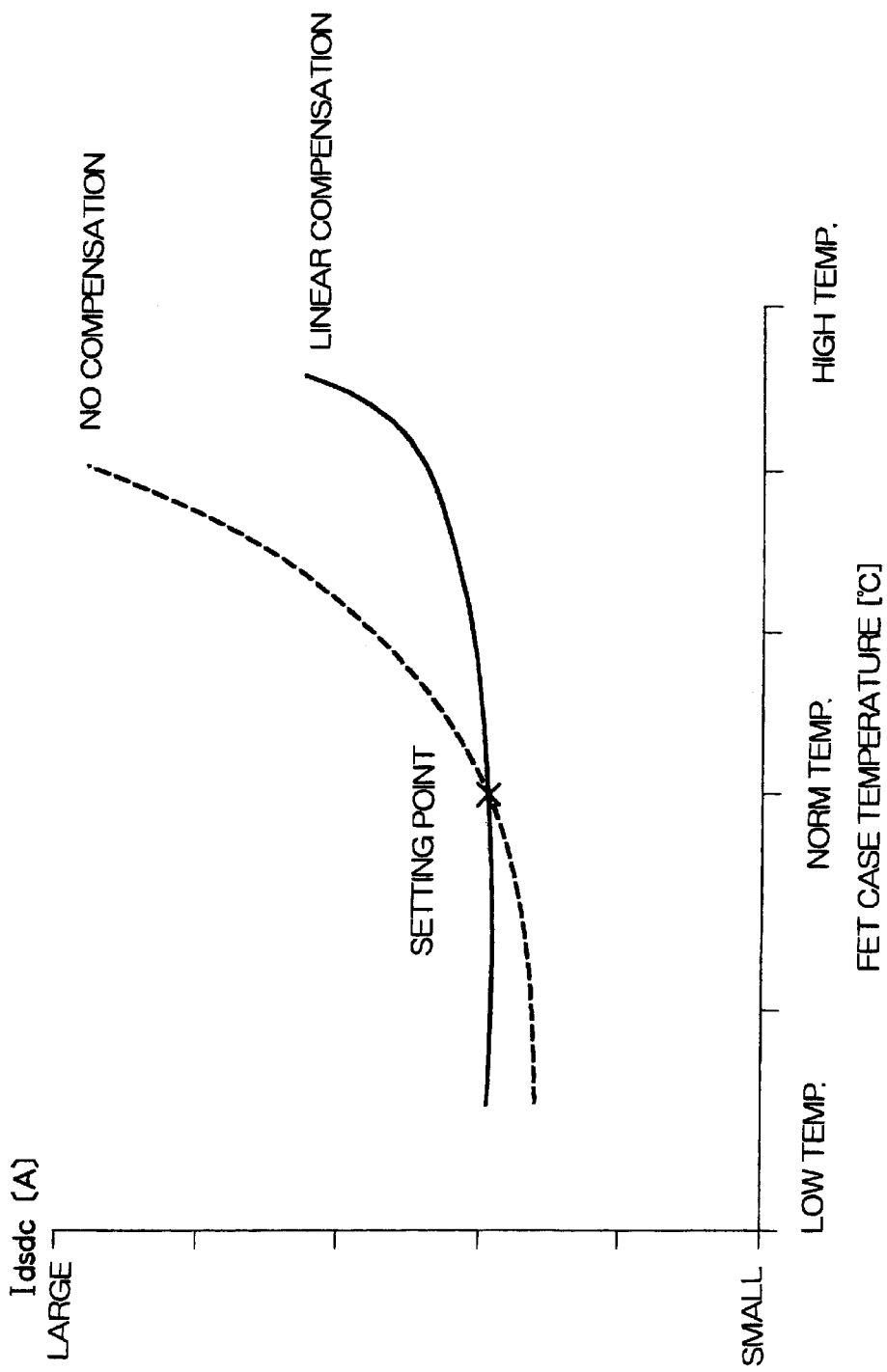
FIG. 5 shows a temperature compensation operation in the prior art shown in FIG. 4.

A preferred embodiment of the present invention will be described hereinafter with reference to the drawings. An identical component with that in the conventional circuits shown in FIGS. 3 and 4 is given an identical reference numeral and its description is omitted.

Figure 1:
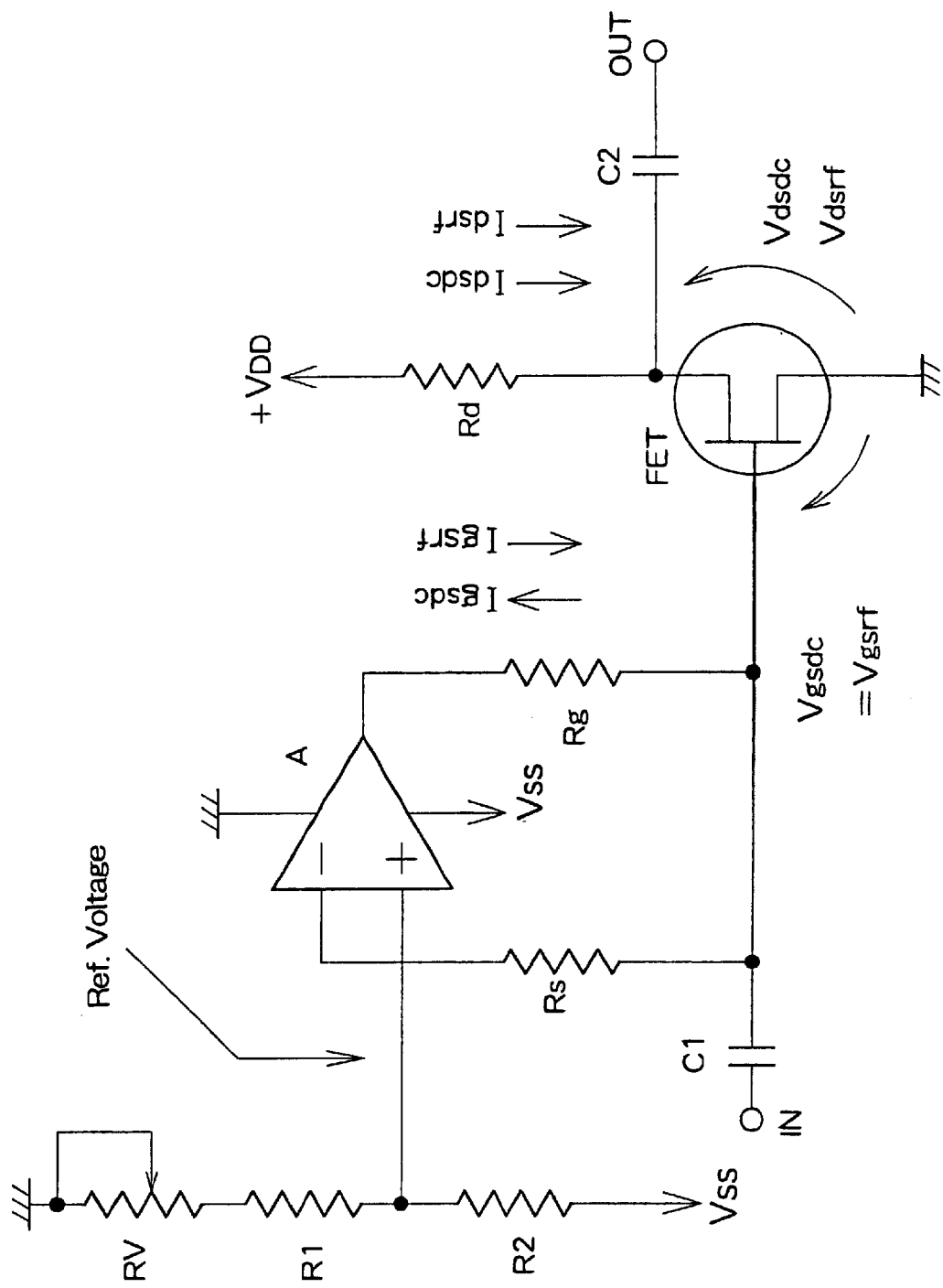
FIG. 1 is a circuit diagram showing a configuration of a radio-frequency amplifier that uses a FET bias circuit relating to an embodiment of the present invention.

FIG. 1 shows an example configuration of an RF amplifier that uses the FET bias circuit relating to an embodiment of the present invention. The circuit shown in this figure is characterized by the circuit at the gate and the circuit at the drain of the FET being separated each other, a closed-loop control circuit coupled to the gate resistor Rg being provided, the closed-loop control circuit being configured using an operational amplifier A, and so forth.

A reference voltage is applied to the non-inverted input terminal of the operational amplifier A and the gate bias voltage Vgsdc of the FET is applied to the inverted input terminal. The output of the operational amplifier A that is generated in accordance with these applied voltages is applied to the gate of the FET via resistor Rg. The reference voltage that is input by the operational amplifier A is generated by the reference voltage generation circuit comprising resistors Rv, R1, and R2. More specifically, the supply voltage from the negative power supply (−VSS) is divided by these resistors so as to generate the reference voltage at the point connecting the resistors R1 and R2. RV is a variable resistor and the adjustment of its resistance enables the reference voltage to be adjusted.

The operational amplifier A operates as a voltage follower. Namely, the voltage that is applied to the inverted input terminal becomes equal to the reference voltage that is applied to the non-inverted input terminal of the operational amplifier A. Described in more detail, the gate current Igsdc that flows out of the FET, flows into the output terminal of the operational amplifier A via resistor Rg, and conversely, the gate current Igsrf that flows into the FET is discharged from the operational amplifier A via resistor Rg. In any of these cases, a voltage drop develops at the current limiting resistor Rg. In the present embodiment, since the operational amplifier A controls the gate bias voltage Vgsdc of the FET so as to become equal to the reference voltage, the gate bias voltage Vgsdc is kept constant, independently of the voltage drop.

In this manner, in the present embodiment in which the closed-loop control of the gate bias voltage Vgsdc of the FET is performed, the circuit at the gate of the FET and the circuit at the drain are separate so that, unlike the prior art shown in FIG. 3, the FET can be operated in any of a class A, class AB, or class B configuration. Furthermore, the change in the gate bias voltage Vgsdc that occurs when the input signal level or the temperature changes can be suppressed by the closed-loop control of the gate bias voltage Vgsdc. Thus, even when the input signal level or the temperature changes, the FET can be operated at a constant gate bias voltage Vgsdc, variations in the drain current Idsdc, such as due to the input signal level, are prevented, and the movement of the FET operating point can be eliminated.

Furthermore, since the voltage drop at the resistor Rg can be ignored, the value of resistor Rg can be selected and designed with priority given to the stability of the RF characteristics, and a drop in the saturation output power that occurred in the circuit shown in FIG. 4 can be prevented.

Furthermore, as described earlier, the mutual conductance gm of the FET has a linear temperature characteristic. Therefore, in the case where temperature compensation is not applied to the temperature characteristics, the drain bias current Idsdc provides linear temperature characteristics as shown by the broken line in FIG. 2. This sort of linear temperature characteristics enables preferable compensation to be achieved with a circuit having a simple configuration.

Figure 2:
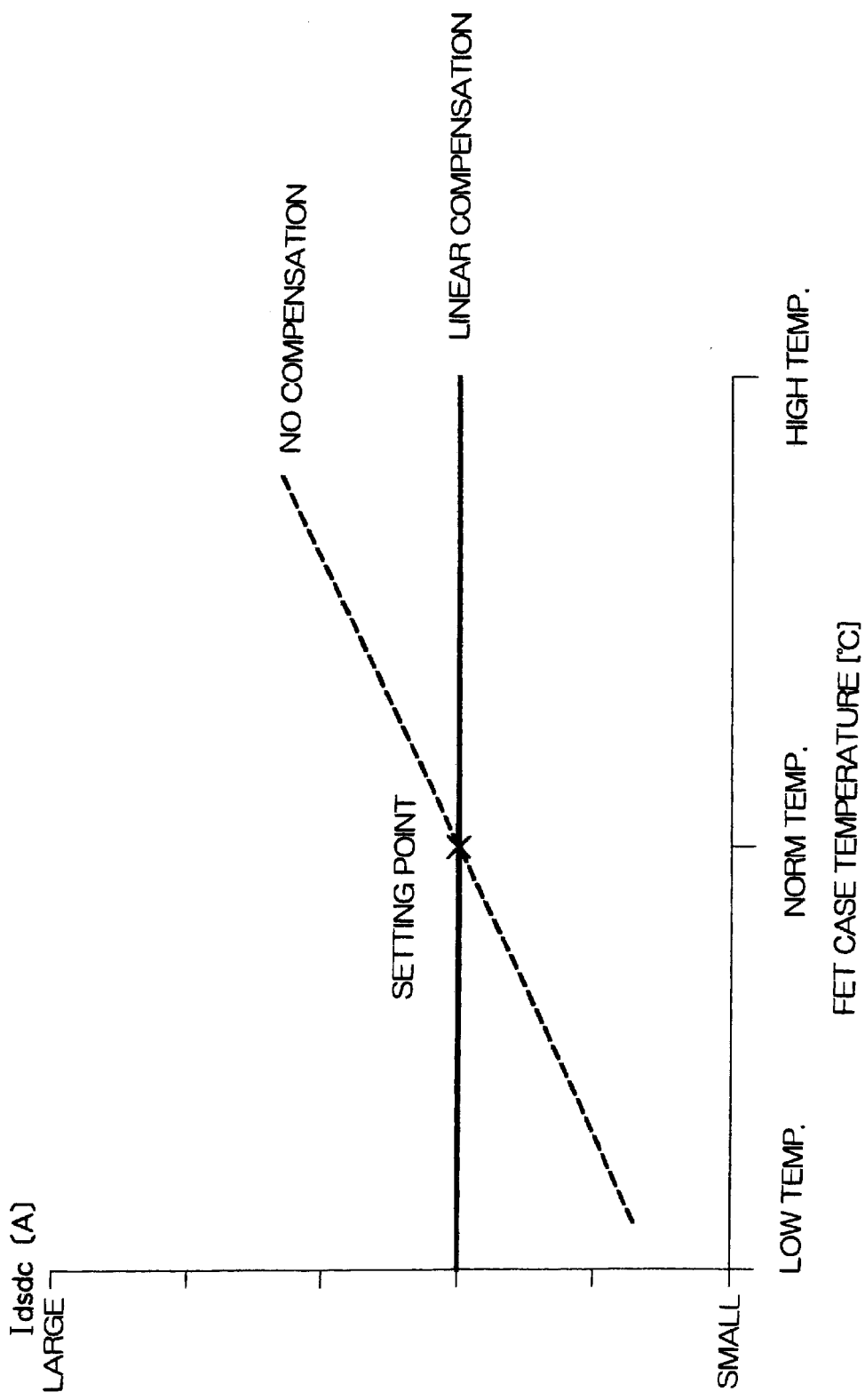
FIG. 2 shows a temperature compensation operation in the embodiment.

Using the circuit of the present embodiment as an example, at least one of either resistor R1 or R2 forming the reference voltage generation circuit is a temperature sensitive element, and the temperature characteristic of the mutual conductance gm of the FET is at least approximately compensated by the temperature characteristic of the temperature sensitive element. As a result, the characteristic shown by the solid line in FIG. 2, namely, a characteristic having almost no change in the drain bias current Idsdc with respect to temperature, can be achieved. Further, the temperature characteristics shown by the broken line in FIG. 2 is a linear characteristic rising toward the right. Thus, in order to achieve the characteristic shown by the solid line, either a temperature sensitive element having a positive temperature coefficient is used for resistor R1, a temperature sensitive element having a negative temperature coefficient is used for resistor R2, or both are used.

Furthermore, since the temperature characteristic of the drain bias current Idsdc has a linear characteristic as described above, thermal runaway of the FET or the resultant damage can be preferably prevented.

Additionally, the present invention can be implemented in a form other than the circuit shown in FIG. 1. First, depending on the FET, a positive power supply is used instead of the −VSS. Furthermore, although a GaAs FET may be given as the type of FET, the present invention is also applicable to other types of FETs. The operational amplifier A is an example of a comparator amplifier or an error amplifier, and the present invention can generally be implemented using a comparator amplifier or an error amplifier. In the present embodiment, although resistor Rs is inserted before the inverted input terminal of the operational amplifier A to suppress the input signal branched to the inverted input terminal of the operational amplifier A, a coil, a capacitor, or other device may also be used in combination. Furthermore, the closed-loop control circuit for the gate bias voltage Vgsdc may be configured using components other than the resistance-type dividing circuit and the operational amplifier A. For example, a voltage regulator may be used instead of the reference voltage generation circuit that is based on resistance-type voltage dividing. In the case where the voltage regulator is used to generate the reference voltage, the output voltage of the voltage regulator must be set or controlled to decrease with the rise in temperature.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A circuit for biasing an FET having a gate, a drain, and a source, the circuit comprising:
   a current limiting resistor having a first end and a second end, said first end being connected to said gate; and
   a closed-loop control circuit connected to said second end, applying and controlling DC voltage to said second end, so that a gate bias voltage that is applied to said gate becomes equal to a reference voltage of a predetermined DC voltage.

2. The circuit according to claim 1 wherein:
   said closed-loop control circuit comprises a reference voltage generation circuit that generates said reference voltage, and an error amplifier that inputs the reference voltage and said gate bias voltage and applies a voltage equivalent to the difference of both inputs to said gate via said current limiting resistor.

3. The circuit according to claim 2 wherein:
   said reference voltage generation circuit has complementary temperature characteristics with respect to the temperature characteristics of mutual conductance of said FET so as to cancel the temperature characteristics occurring in drain current of said FET caused by temperature characteristics of mutual conductance of said FET.

4. A circuit for biasing a FET having a gate, a drain, and a source, the circuit comprising:
   a gate resistor that is connected to the gate of the FET; and
   a closed-loop control circuit coupled to said gate resistor, for controlling voltage applied to the gate of the FET through the gate resistor, such that a predetermined voltage is maintained at the gate of the FET, wherein the closed-loop control unit comprises a reference voltage generation circuit that generates a reference voltage, and an error amplifier that inputs the reference voltage and a gate bias voltage and provides a voltage equivalent to the difference of both inputs to said gate via said gate resistor;
   said reference voltage generation circuit having complementary temperature characteristics with respect to temperature characteristics of mutual conductance of said FET so as to cancel the temperature characteristics occurring in drain currents of said FET caused by said temperature characteristics of mutual conductance.

5. The according to claim 4 further comprising a second resistor coupled to said error amplifier by its inverting input port and said gate of said FET, such that said second resistor suppressing an input signal branched to said inverted input port of said error amplifier.

6. A circuit for temperature compensation, the circuit comprising:
   a single FET having a gate, source, and drain;
   a gate resistor that is connected to the gate of the FET; and
   a closed-loop control circuit coupled to said gate resistor, for controlling voltage applied to the gate of the FET through the gate resistor, such that a predetermined voltage is maintained at the gate of the FET so as to cancel temperature characteristics occurring in said single FET, wherein the closed-loop control unit comprises a reference voltage generation circuit that generates a reference voltage, and an error amplifier that inputs the reference voltage and a gate bias voltage and provides a voltage equivalent to the difference of both inputs to said gate via said gate resistor;
   said reference voltage generation circuit having complementary temperature characteristics with respect to temperature characteristics of mutual conductance of said FET so as to cancel the temperature characteristics occurring in drain currents of said FET caused by said temperature characteristics of mutual conductance.

7. A circuit for temperature compensation, the circuit comprising:
   a single FET having a gate, source, and drain;
   a gate resistor that is connected to the gate of the FET;
   a closed-loop control circuit coupled to said gate resistor, for controlling voltage applied to the gate of the FET through the gate resistor, such that a predetermined voltage is maintained at the gate of the FET so as to cancel temperature characteristics occurring in said single FET, wherein said closed-loop control circuit includes a reference voltage generation circuit that generates a reference voltage, and an error amplifier that inputs the reference voltage and a gate bias voltage and provides a voltage equivalent to the difference of both inputs to said gate via said gate resistor,
   said reference voltage generation circuit having complementary temperature characteristics with respect to temperature characteristics of mutual conductance of said FET so as to cancel the temperature characteristics occurring in drain currents of said FET caused by said temperature characteristics of mutual conductance; and
   a second resistor coupled to said error amplifier by its inverting input port and said gate of said FET, such that said second resistor suppressing an input signal branched to said inverted input port of said error amplifier.

* * * * *